(12) United States Patent
Matsuda et al.

(10) Patent No.: US 12,261,100 B2
(45) Date of Patent: Mar. 25, 2025

(54) COOLING DEVICE

(71) Applicant: MITSUBISHI HEAVY INDUSTRIES, LTD., Tokyo (JP)

(72) Inventors: Hiroki Matsuda, Tokyo (JP); Tsutomu Kawamizu, Tokyo (JP)

(73) Assignee: MITSUBISHI HEAVY INDUSTRIES, LTD., Tokyo (JP)

(*) Notice: Subject to any disclaimer, the term of this patent is extended or adjusted under 35 U.S.C. 154(b) by 419 days.

(21) Appl. No.: 17/829,527

(22) Filed: Jun. 1, 2022

(65) Prior Publication Data
US 2022/0415756 A1 Dec. 29, 2022

(30) Foreign Application Priority Data
Jun. 25, 2021 (JP) ................. 2021-105567

(51) Int. Cl.
*H01L 23/473* (2006.01)
*H01L 23/367* (2006.01)

(52) U.S. Cl.
CPC .......... *H01L 23/473* (2013.01); *H01L 23/367* (2013.01)

(58) Field of Classification Search
CPC ............... H01L 23/367; H01L 23/3672; H01L 23/3675; H01L 23/3677; H01L 23/473; H01L 23/46; H01L 23/467
See application file for complete search history.

(56) References Cited

U.S. PATENT DOCUMENTS

| | | | |
|---|---|---|---|
| 2003/0067748 A1 | 4/2003 | Tamba et al. | |
| 2007/0062674 A1* | 3/2007 | Ippoushi | H01L 23/473 165/80.4 |
| 2010/0172091 A1* | 7/2010 | Nishiura | H01L 23/473 361/689 |
| 2022/0084905 A1 | 3/2022 | Koyama et al. | |

FOREIGN PATENT DOCUMENTS

| | | |
|---|---|---|
| JP | 10-322062 | 12/1998 |
| JP | 2003-116282 | 4/2003 |
| JP | 2011-159663 | 8/2011 |
| WO | 2021/124704 | 6/2021 |

* cited by examiner

*Primary Examiner* — Zandra V Smith
*Assistant Examiner* — Molly K Reida
(74) *Attorney, Agent, or Firm* — Wenderoth, Lind & Ponack, L.L.P.

(57) ABSTRACT

A cooling device that cools a semiconductor component mounted on a surface of a substrate includes a base attached to a back surface of the substrate, and a bottom plate disposed spaced apart from the base. A recessed part recessed toward the substrate side is formed in a region that is a surface, of the base, facing the bottom plate side and corresponds to the semiconductor component.

5 Claims, 5 Drawing Sheets

COOLING DEVICE

CROSS-REFERENCE TO RELATED APPLICATIONS

This application claims the benefit of priority to Japanese Patent Application Number 2021-105567 filed on Jun. 25, 2021. The entire contents of the above-identified application are hereby incorporated by reference.

TECHNICAL FIELD

The disclosure relates to a cooling device.

RELATED ART

As a device for cooling semiconductor components (chips), for example, a device disclosed in JP 2003-116282 A below is known. In the device disclosed in JP 2003-116282 A below, a recess is formed in a housing to which semiconductor components are fixed, and a metal base having a plate shape is attached to cover the recess. The semiconductor components are mounted on the metal base, and a cooling channel is formed directly under the semiconductor components.

SUMMARY

However, when the metal base simply has a plate shape as described above, the metal base has a large thermal resistance between a refrigerant and the semiconductor components. Therefore, the semiconductor components may not be efficiently cooled.

The present disclosure has been made to solve the above problem, and an object of the present disclosure is to provide a cooling device with further improved cooling efficiency.

In order to solve the above problem, a cooling device according to the present disclosure cools semiconductor components mounted on a surface of a substrate. The cooling device includes a base attached to a back surface of the substrate, a plurality of fins protruding from the base, and a bottom plate that supports the plurality of fins between the base and the bottom plate. A recessed part recessed toward the base side is formed in a region that is a surface, of the base, facing the bottom plate side and corresponds to the semiconductor components.

According to the present disclosure, a cooling device with further improved cooling efficiency can be provided.

BRIEF DESCRIPTION OF DRAWINGS

The disclosure will be described with reference to the accompanying drawings, wherein like numbers reference like elements.

DESCRIPTION OF EMBODIMENTS

First Embodiment

Configuration of Substrate and Cooling Device

Figure 1:
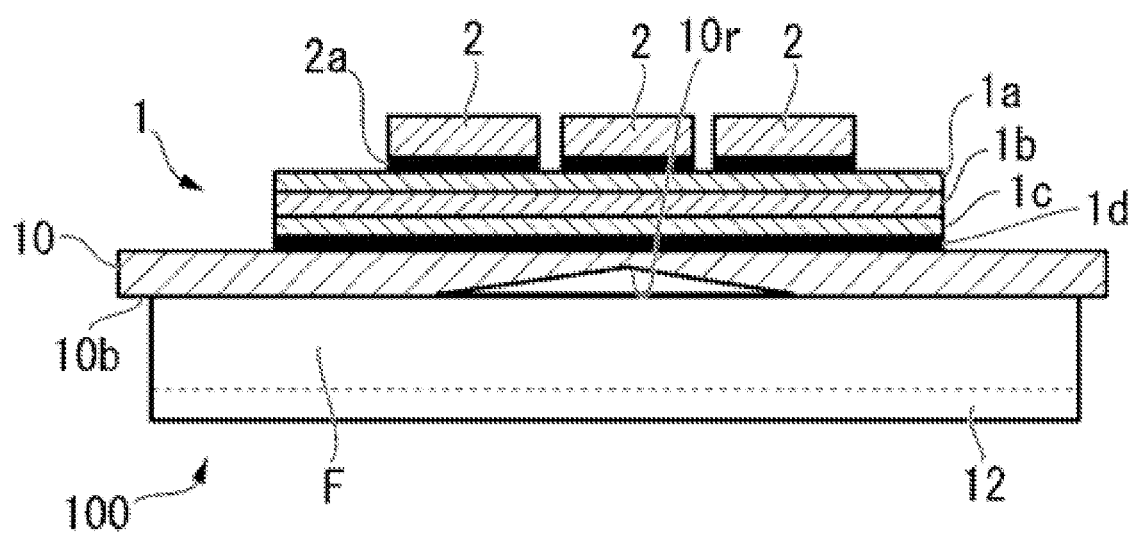
FIG. 1 is a cross-sectional view illustrating the configuration of a cooling device according to a first embodiment of the present disclosure.

Hereinafter, a cooling device 100 according to a first embodiment of the present disclosure will be described with reference to FIG. 1. The cooling device 100 is a device for cooling, by a liquid refrigerant, semiconductor components 2 mounted on a substrate 1. As illustrated in FIG. 1, the substrate 1 includes copper patterns 1a and 1c, a substrate main body 1b, and bonding materials 1d and 2a.

The substrate main body 1b is formed of, for example, a glass epoxy resin or a Bakelite resin into a plate shape. The copper patterns 1a and 1c are deposited on the surface and the back surface of the substrate main body 1b, respectively. A desired printed wiring is formed on the copper patterns 1a and 1c by etching. The bonding material 2a is provided for fixing the semiconductor components 2 to the copper pattern 1a.

A plurality of (three in an example) semiconductor components 2 are disposed on the substrate 1. The semiconductor component 2 is, for example, a power transistor or a power FET, and generates heat as it operates. These semiconductor components 2 are disposed on the substrate 1 at intervals from each other. Furthermore, the semiconductor components 2 are electrically connected to the above copper pattern 1a.

Next, the configuration of the cooling device 100 will be described. As illustrated in FIG. 1, the cooling device 100 includes a base 10 and a bottom plate 12. The base 10 and the bottom plate 12 are integrally formed of a metal material having good thermal conductivity such as aluminum or copper. It is also possible to model the cooling device 100 by additive manufacturing (AM modeling method).

The base 10 is fixed to the back surface of the above substrate 1 (that is, a surface facing an opposite side to the surface on which the semiconductor components 2 are mounted) by the bonding material 1d. The base 10 has a plate shape having a larger area than the substrate 1. As will be described in detail below, a recessed part 10r recessed toward the above substrate 1 side is formed in a central part (that is, a central part of a region corresponding to the plurality of semiconductor components 2) on a back surface 10b of the base 10. In other words, in the region where the recessed part 10r is formed, the plate thickness of the base 10 is smaller than that in other regions. Furthermore, the cross-sectional shape of the recessed part 10r is triangular as an example. The recessed part 10r may have a rectangular cross section or an arcuate cross section. Moreover, the recessed part 10r is a groove extending across the entire length of the base 10.

Operational Effects

Subsequently, an operation of the above cooling device 100 will be described. When the semiconductor components 2 are operated, the semiconductor components 2 generate heat due to internal resistance or the like. When the plurality of semiconductor components 2 are integrated and disposed as described above, the temperature is particularly high in the central part of the integrated region due to thermal interference. When such heat generation is increased, thermal runaway or damage to the semiconductor components 2 may occur. In this regard, the present embodiment employs a configuration in which the semiconductor components 2 are cooled by the cooling device 100.

First, a refrigerant introduced into a flow path F from the outside is circulated through the flow path F in the direction in which the recessed part 10r extends. In this process, the semiconductor components 2 are cooled via the base 10 by heat absorption caused by the refrigerant. However, unlike the above embodiment, when the base 10 simply has a plate shape, the base 10 has a large thermal resistance between the refrigerant and the semiconductor components 2. Therefore, the semiconductor components may not be efficiently cooled. In this regard, in the present embodiment, the recessed part 10r is formed in the base 10.

According to the above configuration, the recessed part 10r is formed in a region, in the base 10, corresponding to the semiconductor components 2. This makes it possible to reduce the thermal resistance of the base 10 in the region compared to other regions. As a consequence, heat transfer between the refrigerant and the semiconductor components 2 is promoted, and the semiconductor components 2 can be efficiently cooled. Furthermore, as compared to a case where the plate thickness of the base 10 is reduced as a whole, only a part of the recessed part 10r is formed, so that it is possible to suppress a decrease in the pressure resistance of the base 10 with respect to the pressure of the refrigerant.

The first embodiment of the present disclosure has been described above. Note that various changes and modifications can be made to the above-described configurations without departing from the gist of the present disclosure.

Second Embodiment

Figure 2:
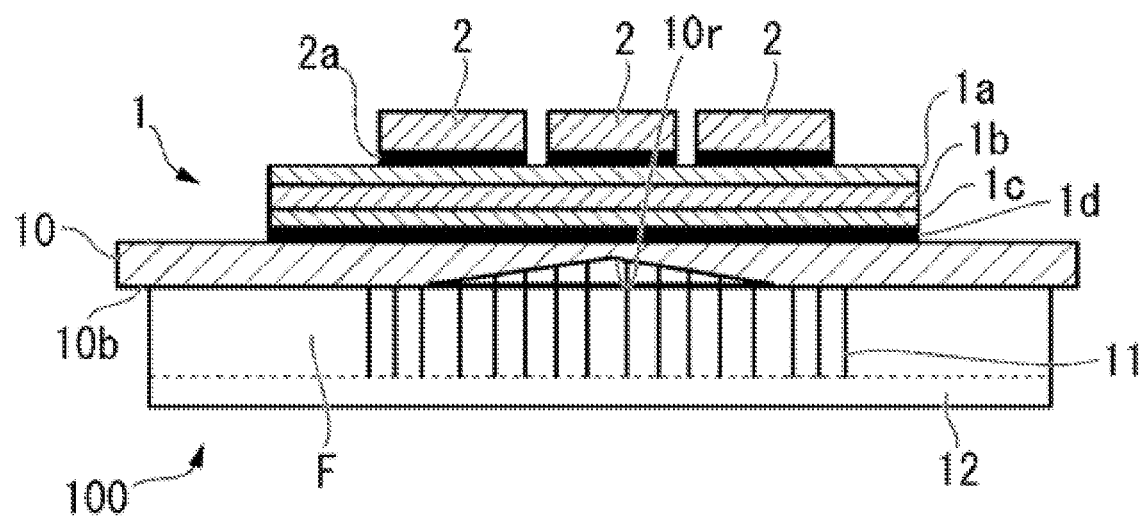
FIG. 2 is a cross-sectional view illustrating the configuration of a cooling device according to a second embodiment of the present disclosure.

Next, a second embodiment of the present disclosure will be described with reference to FIG. 2. The same components as those of the first embodiment are denoted by the same reference signs, and detailed description thereof will be omitted. As illustrated in FIG. 2, in the present embodiment, a plurality of fins 11 are provided on the back surface 10b of the base 10. Each of the fins 11 protrudes in a direction away from the base 10. Furthermore, the plurality of fins 11 are arranged at intervals in the direction in which the recessed part 10r extends.

The above fins 11 are supported by the bottom plate 12 between the base 10 and the bottom plate 12. A space surrounded by the base 10 and the bottom plate 12 is the flow path F for circulating a refrigerant guided from the outside. In the present embodiment, a surface of the bottom plate 12 on the base 10 side is flat. The recessed part 10r is a groove extending across the entire length of the base 10, and the plurality of fins 11 extend in a plate shape in the direction in which the groove (recessed part 10r) extends.

According to the above configuration, a contact area between the refrigerant and the cooling device is increased by the fins 11, so that cooling efficiency can be further improved.

Furthermore, according to the above configuration, the fins 11 extend in the direction in which the groove extends to reduce the possibility that the flow of the refrigerant is obstructed by the fins 11. Accordingly, the flow rate of the refrigerant is secured, and the semiconductor components 2 can be cooled more efficiently.

The second embodiment of the present disclosure has been described above. Note that various changes and modifications can be made to the above-described configurations without departing from the gist of the present disclosure.

Third Embodiment

Figure 3:
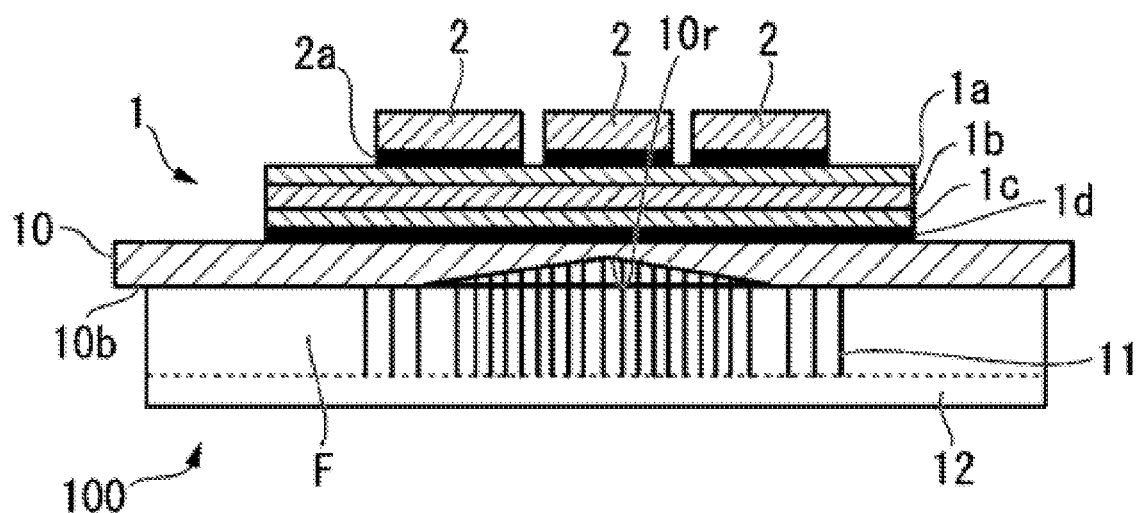
FIG. 3 is a cross-sectional view illustrating the configuration of a cooling device according to a third embodiment of the present disclosure.

Next, a third embodiment of the present disclosure will be described with reference to FIG. 3. The same components as those of the first embodiment are denoted by the same reference signs, and detailed description thereof will be omitted. As illustrated in FIG. 3, in the above cooling device 100 of the present embodiment, each distance between fins 11 provided in the recessed part 10r among the plurality of fins 11 is narrower than that between the other fins 11.

According to the above configuration, the distance between the fins 11 provided in the recessed part 10r is narrow, so that a large contact area between these fins 11 and the refrigerant can be secured compared to other regions. This makes it possible to cool the semiconductor components 2 more efficiently.

The third embodiment of the present disclosure has been described above. Note that various changes and modifications can be made to the above-described configurations without departing from the gist of the present disclosure.

Fourth Embodiment

Figure 4:
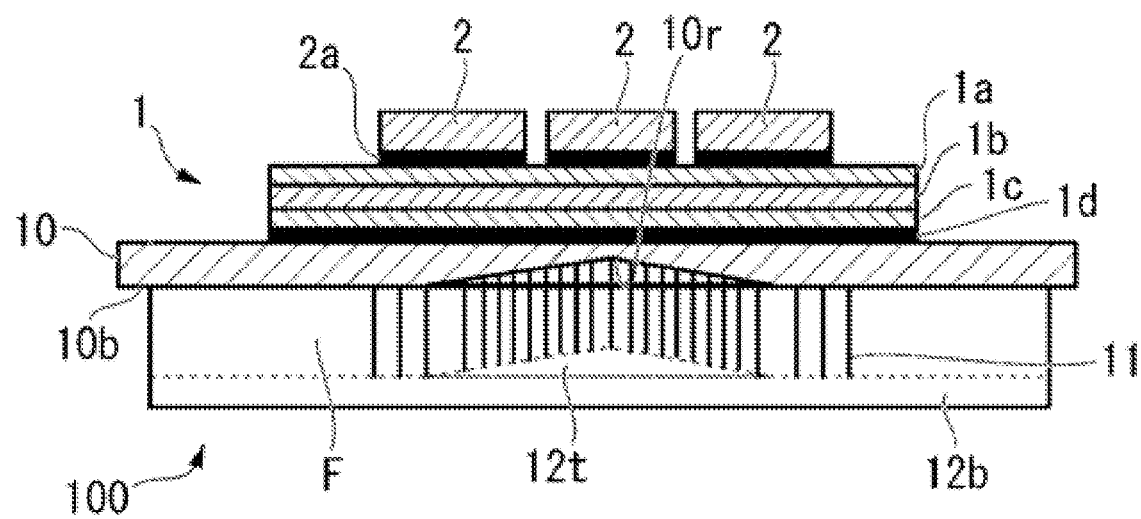
FIG. 4 is a cross-sectional view illustrating the configuration of a cooling device according to a fourth embodiment of the present disclosure.

Next, a fourth embodiment of the present disclosure will be described with reference to FIG. 4. The same components as those in each of the above-described embodiments will be denoted by the same reference signs, and a detailed description thereof will be omitted. As illustrated in FIG. 4, in the present embodiment, the shape of a bottom plate 12b is different from that in the first embodiment. Specifically, a convex part 12t having a shape corresponding to the recessed part 10r is formed in a region of the bottom plate 12b, which faces the recessed part 10r. That is, in the example of FIG. 4, the convex part 12t having a triangular cross-sectional shape is provided corresponding to the recessed part 10r having a triangular cross-sectional shape.

According to the above configuration, the flow path cross-sectional area of the flow path F is constant between a region which is interposed between the recessed part 10r and the convex part 12t in the flow path F, and the other regions. As a consequence, for example, it is possible to reduce the possibility of stagnation or pressure loss when the refrigerant flows into the recessed part 10r. Accordingly, the refrigerant can be circulated more stably, so that the semiconductor components 2 can be cooled more efficiently.

Figure 5:
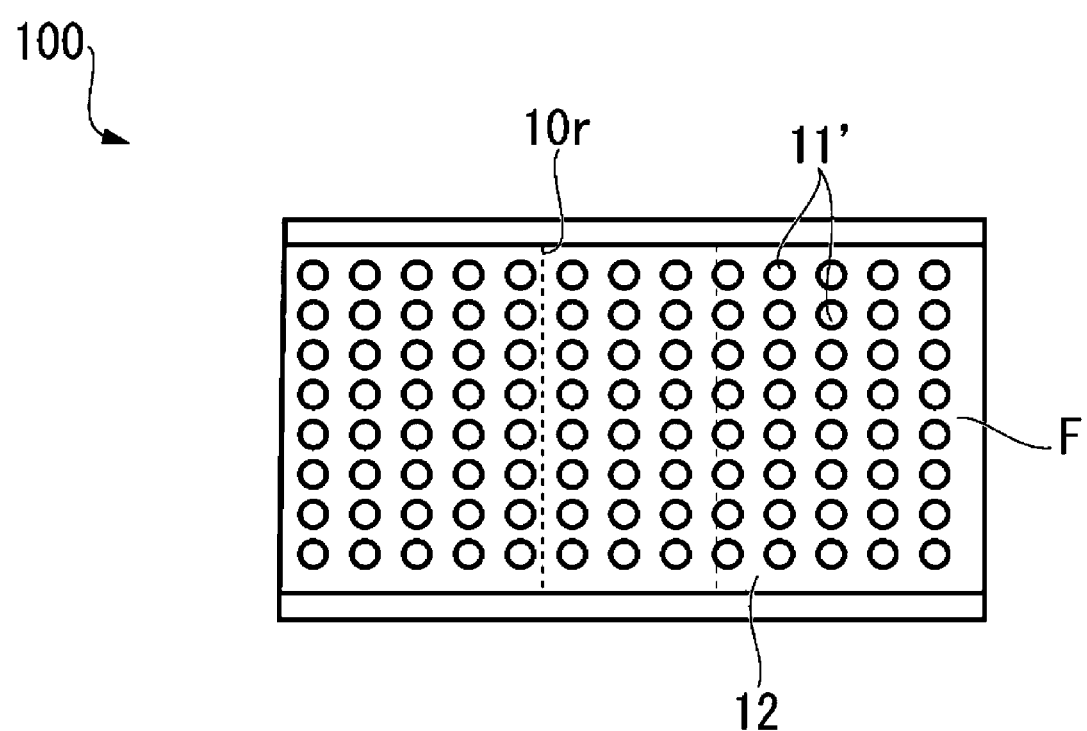
FIG. 5 is a plan view of fins according to a modification of each embodiment of the present disclosure.

The fourth embodiment of the present disclosure has been described above. Note that various changes and modifications can be made to the above-described configurations without departing from the gist of the present disclosure. For example, in each of the above embodiments, an example in which only one recessed part 10r is formed in the central part of the plurality of semiconductor components 2 has been described. However, the number of recessed parts 10r is not limited to one, and one recessed part 10r can also be formed corresponding to each of the semiconductor components 2. In such a case, it is desirable that the same number of convex parts 12t described in the fourth embodiment as the recessed parts 10r are provided. Furthermore, the flow direction of a refrigerant does not necessarily coincide with the direction in which the fins 11 extend, and may be a direction intersecting the direction in which the fins 11 extend. Furthermore, the shape of the fin 11 is not limited to a plate shape, and as illustrated in FIG. 5, pins 11' can also be used instead of the fins 11. Even in such a case, as described in the third embodiment, each distance between the pins 11' provided in the recessed part 10r can be narrower than that between the other pins 11'.

Notes

The cooling device 100 according to each of the embodiments is understood as follows, for example.

(1) The cooling device 100 according to the first aspect cools the semiconductor components 2 mounted on a surface of the substrate 1. The cooling device 100 includes the base 10 attached to a back surface of the substrate and the bottom plate 12 disposed spaced apart from the base 10, and the recessed part 10r recessed toward the substrate 1 side is formed in a region that is a surface of the base 10 and corresponds to the semiconductor components 2, the surface facing the bottom plate 12 side.

According to the above configuration, the recessed part 10r is formed in a region, in the base 10, corresponding to the semiconductor components 2. This makes it possible to reduce the thermal resistance of the base 10 in the region compared to other regions. As a consequence, heat transfer between the refrigerant and the semiconductor components 2 is promoted, and the semiconductor components 2 can be efficiently cooled.

(2) The cooling device 100 according to the second aspect further includes the plurality of fins 11 protruding from the base 10.

According to the above configuration, a contact area between the refrigerant and the cooling device is increased by the fins 11, so that cooling efficiency can be further improved.

(3) In the cooling device 100 according to the third aspect, the recessed part 10r is a groove extending across the entire length of the base 10, and the plurality of fins 11 extend in a plate shape in the direction in which the groove extends.

According to the above configuration, the fins 11 extend in the direction in which the groove extends, so that it is possible to reduce the possibility that the flow of the refrigerant is obstructed by the fins 11. Accordingly, the flow rate of the refrigerant is secured, and the semiconductor components 2 can be cooled more efficiently.

(4) In the cooling device 100 according to the fourth aspect, each distance between fins 11 provided in the recessed part 10r among the plurality of fins 11 is narrower than that between the other fins 11.

According to the above configuration, the distance between the fins 11 provided in the recessed part 10r is narrow, so that a large contact area between these fins 11 and the refrigerant can be secured compared to other regions. This makes it possible to cool the semiconductor components 2 more efficiently.

(5) In the cooling device 100 according to the fifth aspect, the convex part 12t having a shape corresponding to the recessed part 10r is formed in a region of the bottom plate 12b, which faces the recessed part 10r.

According to the above configuration, the flow path cross-sectional area of the flow path F is constant between a region which is interposed between the recessed part 10r and the convex part 12t, and the other regions. As a consequence, for example, it is possible to reduce the possibility of stagnation or pressure loss when the refrigerant flows into the recessed part 10r.

(6) The cooling device 100 according to the sixth aspect further includes the plurality of pins 11' protruding from the base 10.

According to the above configuration, a contact area between the refrigerant and the cooling device is increased by the pins 11', so that cooling efficiency can be further improved.

(7) In the cooling device 100 according to the seventh aspect, each distance between pins 11' provided in the recessed part 10r among the plurality of pins 11' is narrower than that between the other pins 11'.

According to the above configuration, the distance between the pins 11' provided in the recessed part 10r is narrow, so that a large contact area between these pins 11' and the refrigerant can be secured compared to other regions. This makes it possible to cool the semiconductor components 2 more efficiently.

(8) In the cooling device 100 according to the eighth aspect, the convex part 12t having a shape corresponding to the recessed part 10r is formed in a region, of the bottom plate 12b, facing the recessed part 10r.

According to the above configuration, the flow path cross-sectional area of the flow path F is constant between a region which is interposed between the recessed part 10r and the convex part 12t, and the other regions. As a consequence, for example, it is possible to reduce the possibility of stagnation or pressure loss when the refrigerant flows into the recessed part 10r.

While preferred embodiments of the invention have been described as above, it is to be understood that variations and modifications will be apparent to those skilled in the art without departing from the scope and spirit of the invention. The scope of the invention, therefore, is to be determined solely by the following claims.

The invention claimed is:

1. A semiconductor component cooling device comprising:
   a semiconductor component mounted on a surface of a substrate;
   a base attached to a back surface of the substrate;
   a bottom plate disposed spaced apart from the base; and
   a plurality of fins protruding from the base, wherein
   a recessed part recessed toward a substrate side is formed in a region that is a surface, of the base, facing a bottom plate side and is directly below the semiconductor component, and
   a distance between fins provided in recessed part among the plurality of fins is narrower than a distance between the fins other than the fins provided in the recessed part.

2. The semiconductor component cooling device according to claim 1, wherein the recessed part is a groove extending across an entire length of the base, and
   the plurality of fins extend in a plate shape in a direction in which the groove extends.

3. The semiconductor component cooling device according to claim 1, wherein a convex part having a shape corresponding to the recessed part is formed in a region, of the bottom plate, facing the recessed part.

4. A semiconductor component cooling device comprising:
   a semiconductor component mounted on a surface of a substrate;
   a base attached to a back surface of the substrate;
   a bottom plate disposed spaced apart from the base; and
   a plurality of pins protruding from the base, wherein
   a recessed part recessed toward a substrate side is formed in a region that is a surface, of the base, facing a bottom plate side and is directly below the semiconductor component, and
   a distance between pins provided in the recessed part among the plurality of pins is narrower than a distance between the pins other than the pins provided in the recessed part.

5. The semiconductor component cooling device according to claim 4, wherein a convex part having a shape corresponding to the recessed part is formed in a region, of the bottom plate, facing the recessed part.

* * * * *